(12) United States Patent
Chen et al.

(10) Patent No.: US 8,405,213 B2
(45) Date of Patent: Mar. 26, 2013

(54) SEMICONDUCTOR PACKAGE INCLUDING A STACKING ELEMENT

(75) Inventors: Chia-Ching Chen, Kaohsiung (TW); Yi-Chuan Ding, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 241 days.

(21) Appl. No.: 12/874,144

(22) Filed: Sep. 1, 2010

(65) Prior Publication Data

US 2011/0227220 A1   Sep. 22, 2011

(30) Foreign Application Priority Data

Mar. 22, 2010   (TW) ............................... 99108423 A

(51) Int. Cl.
*H01L 23/48*   (2006.01)
*H01L 21/50*   (2006.01)

(52) U.S. Cl. ......... 257/738; 257/E23.011; 257/E23.021; 257/E21.499; 257/737; 257/777; 257/778; 257/723; 257/685; 257/686

(58) Field of Classification Search .................. 257/738, 257/E23.011, E23.021, E21.499, 737, 777, 257/778, 723, 685, 686
See application file for complete search history.

(56) References Cited

U.S. PATENT DOCUMENTS

| | | |
|---|---|---|
| 3,959,874 A | 6/1976 | Coucoulas |
| 4,783,695 A | 11/1988 | Eichelberger et al. |
| 5,019,535 A | 5/1991 | Wojnarowski et al. |
| 5,091,769 A | 2/1992 | Eichelberger |
| 5,111,278 A | 5/1992 | Eichelberger |
| 5,120,678 A | 6/1992 | Moore et al. |
| 5,149,662 A | 9/1992 | Eichelberger |
| 5,151,776 A | 9/1992 | Wojnarowski et al. |
| 5,157,589 A | 10/1992 | Cole, Jr. et al. |
| 5,225,023 A | 7/1993 | Wojnarowski et al. |
| 5,241,456 A | 8/1993 | Marcinkiewicz et al. |
| 5,250,843 A | 10/1993 | Eichelberger |
| 5,315,486 A | 5/1994 | Fillion et al. |
| 5,324,687 A | 6/1994 | Wojnarowski |
| 5,353,195 A | 10/1994 | Fillion et al. |
| 5,353,498 A | 10/1994 | Fillion et al. |
| 5,422,513 A | 6/1995 | Marcinkiewicz et al. |
| 5,519,936 A | 5/1996 | Andros et al. |
| 5,527,741 A | 6/1996 | Cole et al. |
| 5,546,654 A | 8/1996 | Wojnarowski et al. |
| 5,554,887 A | 9/1996 | Sawai et al. |
| 5,567,656 A | 10/1996 | Chun |

(Continued)

FOREIGN PATENT DOCUMENTS

| | | |
|---|---|---|
| CN | 1524293 A | 10/2001 |
| WO | WO 0233751 | 4/2002 |

OTHER PUBLICATIONS

Ding et al., U.S. Appl. No. 12/753,840, filed Apr. 2, 2010 for "Semiconductor Device Packages with Fan-Out and with Connecting Elements for Stacking and Manufacturing Methods Thereof".
Ding et al., U.S. Appl. No. 12/753,837, filed Apr. 2, 2010 for "Wafer-Level Semiconductor Device Packages with Stacking Functionality."
Chen et al., U.S. Appl. No. 12/753,843, filed Apr. 2, 2010 for "Stacked Semiconductor Device Package Assemblies with Reduced Wire Sweep and Manufacturing Methods Thereof."

(Continued)

*Primary Examiner* — A O Williams
(74) *Attorney, Agent, or Firm* — Foley & Lardner LLP

(57) ABSTRACT

A semiconductor package includes a set of stud bumps, which can be formed by wire bonding technology and can be bonded or joined to a semiconductor element to form a stacked package assembly. Since the process of bonding the semiconductor element to the stud bumps can be carried out without reflow, an undesirable deformation resulting from high temperatures can be controlled or reduced.

20 Claims, 5 Drawing Sheets

U.S. PATENT DOCUMENTS

| | | | |
|---|---|---|---|
| 5,703,400 | A | 12/1997 | Wojnarowski et al. |
| 5,710,062 | A | 1/1998 | Sawai et al. |
| 5,745,984 | A | 5/1998 | Cole, Jr. et al. |
| 5,834,340 | A | 11/1998 | Sawai et al. |
| 5,841,193 | A | 11/1998 | Eichelberger |
| 5,866,952 | A | 2/1999 | Wojnarowski et al. |
| 6,046,071 | A | 4/2000 | Sawai et al. |
| 6,080,932 | A | 6/2000 | Smith et al. |
| 6,159,767 | A | 12/2000 | Eichelberger et al. |
| 6,232,151 | B1 | 5/2001 | Ozmat et al. |
| 6,239,482 | B1 | 5/2001 | Fillion et al. |
| 6,265,765 | B1 | 7/2001 | DiStefano et al. |
| 6,294,741 | B1 | 9/2001 | Cole, Jr. et al. |
| 6,306,680 | B1 | 10/2001 | Fillion et al. |
| 6,358,780 | B1 | 3/2002 | Smith et al. |
| 6,377,461 | B1 | 4/2002 | Ozmat et al. |
| 6,396,148 | B1 | 5/2002 | Eichelberger et al. |
| 6,426,545 | B1 | 7/2002 | Eichelberger et al. |
| 6,486,006 | B2 | 11/2002 | Hirano et al. |
| 6,555,908 | B1 | 4/2003 | Eichelberger |
| 6,586,822 | B1 | 7/2003 | Vu et al. |
| 6,680,529 | B2 | 1/2004 | Chen et al. |
| 6,701,614 | B2 | 3/2004 | Ding et al. |
| 6,818,544 | B2 | 11/2004 | Eichelberger et al. |
| 6,838,776 | B2 | 1/2005 | Leal et al. |
| 6,845,554 | B2 | 1/2005 | Frankowsky et al. |
| 6,921,683 | B2 | 7/2005 | Nakayama |
| 6,921,975 | B2 | 7/2005 | Leal et al. |
| 6,953,708 | B2 | 10/2005 | Hedler et al. |
| 7,015,075 | B2 | 3/2006 | Fay et al. |
| 7,045,908 | B2 | 5/2006 | Ohsumi |
| 7,048,450 | B2 | 5/2006 | Beer et al. |
| 7,087,991 | B2 | 8/2006 | Chen et al. |
| 7,091,595 | B2 | 8/2006 | Fuergut et al. |
| 7,112,467 | B2 | 9/2006 | Eichelberger et al. |
| 7,141,884 | B2 | 11/2006 | Kojima et al. |
| 7,145,228 | B2 | 12/2006 | Yean et al. |
| 7,163,843 | B2 | 1/2007 | Kiendl et al. |
| 7,187,070 | B2 | 3/2007 | Chu et al. |
| 7,294,791 | B2 | 11/2007 | Danoski et al. |
| 7,344,917 | B2 | 3/2008 | Gautham |
| 7,361,533 | B1 | 4/2008 | Huemoeller et al. |
| 7,361,987 | B2 | 4/2008 | Leal et al. |
| 7,364,944 | B2 | 4/2008 | Huang et al. |
| 7,371,617 | B2 | 5/2008 | Tsai et al. |
| 7,425,464 | B2 | 9/2008 | Fay et al. |
| 7,453,148 | B2 | 11/2008 | Yang et al. |
| 7,476,563 | B2 | 1/2009 | Mangrum et al. |
| 7,482,198 | B2 | 1/2009 | Bauer et al. |
| 7,501,310 | B2 | 3/2009 | Yang et al. |
| 7,511,365 | B2 | 3/2009 | Wu et al. |
| 7,514,767 | B2 | 4/2009 | Yang |
| 7,566,969 | B2 | 7/2009 | Shimanuki |
| 7,575,173 | B2 | 8/2009 | Fuergut et al. |
| 7,588,951 | B2 | 9/2009 | Mangrum et al. |
| 7,595,226 | B2 | 9/2009 | Lytle et al. |
| 7,595,553 | B2 | 9/2009 | Nagamatsu et al. |
| 7,619,304 | B2 | 11/2009 | Bauer et al. |
| 7,619,901 | B2 | 11/2009 | Eichelberger et al. |
| 7,622,733 | B2 | 11/2009 | Fuergut et al. |
| 7,655,501 | B2 | 2/2010 | Yang et al. |
| 7,662,667 | B2 | 2/2010 | Shen |
| 7,667,318 | B2 | 2/2010 | Yang et al. |
| 7,675,157 | B2 | 3/2010 | Liu et al. |
| 7,692,286 | B1 | 4/2010 | Huemoeller et al. |
| 7,714,431 | B1 | 5/2010 | Huemoeller et al. |
| 7,727,803 | B2 | 6/2010 | Yamagata |
| 7,732,242 | B2 | 6/2010 | Brunnbauer et al. |
| 7,741,151 | B2 | 6/2010 | Amrine et al. |
| 7,759,163 | B2 | 7/2010 | Kroeninger et al. |
| 7,763,976 | B2 | 7/2010 | Tang et al. |
| 7,767,495 | B2 | 8/2010 | Fuergut et al. |
| 7,807,512 | B2 | 10/2010 | Lee et al. |
| 7,812,434 | B2 | 10/2010 | Yang |
| 7,830,004 | B2 | 11/2010 | Wu et al. |
| 7,834,464 | B2 | 11/2010 | Meyer et al. |
| 7,932,599 | B2 | 4/2011 | Kiendl et al. |
| 7,948,090 | B2 | 5/2011 | Manepalli et al. |
| 8,017,515 | B2 | 9/2011 | Marimuthu et al. |
| 8,035,213 | B2 | 10/2011 | Lee et al. |
| 8,039,303 | B2 | 10/2011 | Shim et al. |
| 8,110,916 | B2 | 2/2012 | Weng et al. |
| 8,193,647 | B2 | 6/2012 | Hsieh et al. |
| 8,278,746 | B2 | 10/2012 | Ding et al. |
| 2003/0090883 | A1 | 5/2003 | Asahi et al. |
| 2004/0012099 | A1 | 1/2004 | Nakayama |
| 2004/0178500 | A1 | 9/2004 | Usui |
| 2005/0253244 | A1 | 11/2005 | Chang |
| 2006/0065387 | A1 | 3/2006 | Tonapi et al. |
| 2006/0071315 | A1 | 4/2006 | Oh et al. |
| 2006/0231944 | A1 | 10/2006 | Huang et al. |
| 2007/0096311 | A1 | 5/2007 | Humpston et al. |
| 2007/0176281 | A1 | 8/2007 | Kim et al. |
| 2007/0190690 | A1 | 8/2007 | Chow et al. |
| 2007/0222054 | A1 | 9/2007 | Hembree |
| 2007/0234563 | A1 | 10/2007 | Sakaguchi et al. |
| 2008/0137314 | A1 | 6/2008 | Salama et al. |
| 2009/0075428 | A1 | 3/2009 | Tang et al. |
| 2009/0101400 | A1 | 4/2009 | Yamakoshi |
| 2009/0102066 | A1 | 4/2009 | Lee et al. |
| 2009/0127686 | A1 | 5/2009 | Yang et al. |
| 2009/0129037 | A1 | 5/2009 | Yoshino |
| 2009/0224391 | A1 | 9/2009 | Lin et al. |
| 2009/0236686 | A1 | 9/2009 | Shim et al. |
| 2009/0261466 | A1 | 10/2009 | Pagaila et al. |
| 2010/0006330 | A1 | 1/2010 | Fu et al. |
| 2010/0006994 | A1 | 1/2010 | Shim et al. |
| 2010/0072599 | A1 | 3/2010 | Camacho et al. |
| 2010/0072618 | A1 | 3/2010 | Camacho et al. |
| 2010/0084759 | A1 | 4/2010 | Shen |
| 2010/0096739 | A1 | 4/2010 | Kawabata et al. |
| 2010/0109132 | A1 | 5/2010 | Ko et al. |
| 2010/0214780 | A1 | 8/2010 | Villard |
| 2010/0224983 | A1 | 9/2010 | Huang et al. |
| 2010/0244208 | A1 | 9/2010 | Pagaila et al. |
| 2010/0308449 | A1 | 12/2010 | Yang et al. |
| 2010/0314746 | A1 | 12/2010 | Hsieh et al. |
| 2010/0320585 | A1 | 12/2010 | Jiang et al. |
| 2010/0320593 | A1 | 12/2010 | Weng et al. |
| 2011/0018118 | A1 | 1/2011 | Hsieh et al. |
| 2011/0018124 | A1 | 1/2011 | Yang et al. |
| 2011/0037169 | A1 | 2/2011 | Pagaila et al. |
| 2011/0068453 | A1 | 3/2011 | Cho et al. |
| 2011/0068459 | A1 | 3/2011 | Pagaila et al. |
| 2011/0074008 | A1 | 3/2011 | Hsieh |
| 2011/0115060 | A1 | 5/2011 | Chiu et al. |
| 2011/0127654 | A1 | 6/2011 | Weng et al. |
| 2011/0140364 | A1 | 6/2011 | Head |
| 2011/0169150 | A1 | 7/2011 | Su et al. |
| 2011/0177654 | A1 * | 7/2011 | Lee et al. ............ 438/107 |
| 2011/0194265 | A1 | 8/2011 | Su et al. |
| 2011/0227219 | A1 | 9/2011 | Alvarado et al. |
| 2011/0241192 | A1 * | 10/2011 | Ding et al. ............ 257/686 |
| 2011/0241193 | A1 | 10/2011 | Ding et al. |
| 2011/0241194 | A1 | 10/2011 | Chen et al. |
| 2011/0278741 | A1 | 11/2011 | Chua et al. |
| 2011/0309488 | A1 * | 12/2011 | Pagaila ............ 257/692 |
| 2012/0038053 | A1 * | 2/2012 | Oh et al. ............ 257/773 |
| 2012/0056321 | A1 * | 3/2012 | Pagaila ............ 257/737 |
| 2012/0077311 | A1 * | 3/2012 | Kim et al. ............ 438/107 |
| 2012/0119373 | A1 * | 5/2012 | Hunt ............ 257/774 |
| 2012/0153472 | A1 * | 6/2012 | Pagaila et al. ............ 257/738 |
| 2012/0153493 | A1 | 6/2012 | Lee et al. |
| 2012/0175732 | A1 * | 7/2012 | Lin et al. ............ 257/531 |
| 2012/0199972 | A1 * | 8/2012 | Pagaila et al. ............ 257/737 |

OTHER PUBLICATIONS

Lee et al., U.S. Appl. No. 12/972,046, filed Dec. 17, 2010 for "Embedded Component Device and Manufacturing Methods Thereof."

Hunt et al., U.S. Appl. No. 12/944,697, filed Nov. 11, 2010 for "Wafer Level Semiconductor Package and Manufacturing Methods Thereof."

* cited by examiner

SEMICONDUCTOR PACKAGE INCLUDING A STACKING ELEMENT

CROSS REFERENCE TO RELATED APPLICATION

This application claims the benefit of Taiwan Application No. 99108423, filed on Mar. 22, 2010, the disclosure of which is incorporated herein by reference in its entirety.

FIELD OF THE INVENTION

The invention relates, in general, to a semiconductor package and a manufacturing method thereof, and, more particularly, to a semiconductor package including a stud bump and a manufacturing method thereof.

BACKGROUND

A conventional stacked semiconductor structure is formed by stacking semiconductor packages. Each semiconductor package includes solder balls formed on the semiconductor package by a reflow process. The adjacent and stacked semiconductor packages are electrically connected through solder balls by a reflow process.

Before stacking, a reflow process is applied to semiconductor packages to form solder balls, and, during stacking, the reflow process is again applied to the semiconductor packages. That is, the reflow process is applied to each semiconductor package at least twice. However, high temperatures during the reflow process can lead to warpage of the semiconductor packages, causing the resulting stacked semiconductor structure to be deformed.

It is against this background that a need arose to develop the semiconductor packages and the methods described herein.

SUMMARY

Embodiments of the invention are directed to a semiconductor package and a manufacturing method thereof. The semiconductor package includes a stud bump formed by wire bonding technology, and the stub bump allows bonding to another semiconductor package or device. Since the process of bonding to the stud bump can be carried out without a reflow process, deformation associated with the reflow process can be avoided or reduced.

According to a first aspect of an embodiment of the invention, a semiconductor package is provided. The semiconductor package includes a semiconductor device, a package body, a first dielectric layer, a first patterned conductive layer, a via conductive structure, a second patterned conductive layer, and a stud bump. The semiconductor device includes a side surface, an active surface, and a back surface opposite to the active surface, and includes a pad formed adjacent to the active surface. The package body includes a via, a first package surface, and a second package surface opposite to the first package surface. The via extends from the first package surface to the second package surface. The package body covers the back surface and the side surface. The first dielectric layer is formed adjacent to the first package surface and defines a first aperture from which the via is exposed. The via conductive structure is formed in the via. The first patterned conductive layer is formed adjacent to the first dielectric layer and extends to the via conductive structure. The second patterned conductive layer is formed adjacent to the second package surface and extends to the via conductive structure. The stud bump is formed adjacent to the second patterned conductive layer.

According to a second aspect of an embodiment of the invention, a manufacturing method is provided. The manufacturing method includes the operations. A carrier with an adhesive layer is provided. A plurality of semiconductor devices are disposed adjacent to the adhesive layer, wherein each semiconductor device includes a side surface, an active surface, and a back surface opposite to the active surface, and includes a pad formed adjacent to the active surface and facing the adhesive layer. The side surface and the back surface of each semiconductor device are covered by a package body, wherein the package body includes a first package surface and a second package surface opposite to the first package surface. A plurality of vias are formed in the package body, wherein the vias extend from the first package surface to the second package surface. The carrier and the adhesive layer are removed so that the first package surface exposes the pad of each semiconductor device. A first dielectric layer is formed adjacent to the first package surface, wherein the first dielectric layer defines a plurality of first apertures which the vias are exposed. A via conductive structure is formed in each via. A patterned conductive layer is formed adjacent to the first dielectric layer and extending to via conductive structure. A second patterned conductive layer is formed adjacent to the second package surface and extending to the via conductive structure. A stud bump is formed adjacent to the second patterned conductive layer by wire bonding technology. The package body is singulated to form separated semiconductor packages.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

DETAILED DESCRIPTION

Definitions

The following definitions apply to some of the aspects described with respect to some embodiments of the invention. These definitions may likewise be expanded upon herein.

As used herein, the singular terms "a," "an," and "the" include plural referents unless the context clearly dictates otherwise. Thus, for example, reference to a component can include multiple components unless the context clearly dictates otherwise.

As used herein, the term "set" refers to a collection of one or more components. Thus, for example, a set of components can include a single component or multiple components. Components of a set also can be referred as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms, such as "inner," "interior," "outer," "exterior," "top," "bottom," "upper," "upwardly," "lower," "downwardly," "vertical," "vertically," "lateral," "laterally," "side," "above," and "below," refer to an orientation of a set of components with respect to one another, such as in accordance with the drawings, but do not require a particular orientation of those components during manufacturing or use.

As used herein, the terms "connect," "connected," "connecting," and "connection" refer to an operational coupling or linking. Connected components can be directly coupled to one another or can be indirectly coupled to one another, such as through another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$. Electrical conductivity of a material can sometimes vary with temperature. Unless otherwise specified, electrical conductivity of a material is defined at room temperature.

Figure 1:
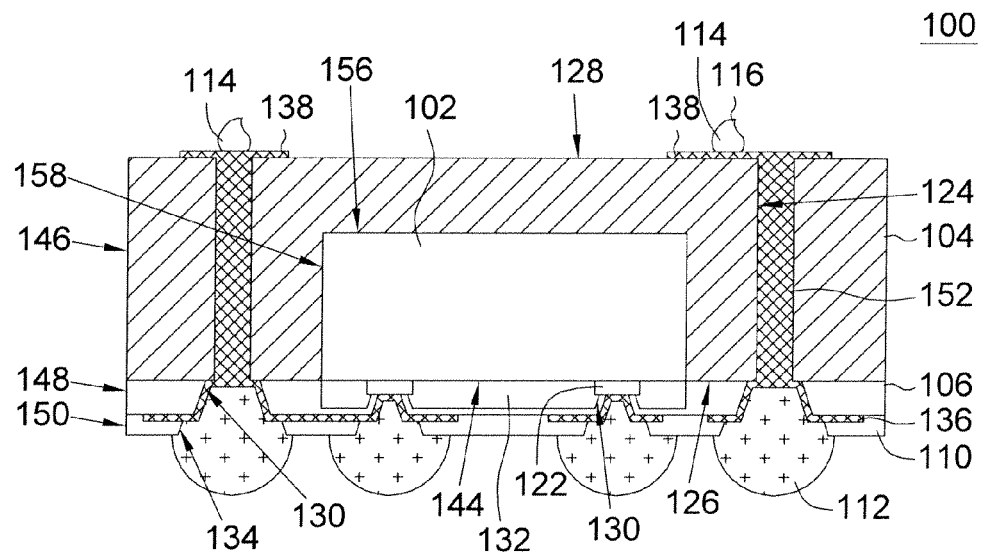
FIG. 1 shows a cross-sectional view of a semiconductor package according to an embodiment of the invention.

Referring to FIG. 1, a stackable semiconductor package 100 according to an embodiment of the invention is shown. The semiconductor package 100 includes a set of vias or through-holes 124, a semiconductor device 102 (e.g., a chip or other active or passive semiconductor device), a package body 104, a first dielectric layer 106, a first patterned conductive layer 136, a set of via conductive structures 152, a second patterned conductive layer 138, a second dielectric layer 110, and a set of solder balls 112. In the illustrated embodiment, the semiconductor package 100 also includes a set of stacking elements that provide stacking functionality, and, in particular, includes a set of first stud bumps 114.

The package body 104, which can be formed from a resin or other encapsulant, includes a first package surface 126 and a second package surface 128 opposite to the first package surface 126.

The second patterned conductive layer 138 is formed adjacent to the second package surface 128, and the first stud bumps 114 are formed adjacent to the second patterned conductive layer 138. The second patterned conductive layer 138 can be formed from a metal, a metal alloy, or other electrically conductive material. At least one of the first stud bumps 114 (at the left-hand side of FIG. 1 for example) can overlap a corresponding via 124, and at least one of the first stud bumps 114 (at the right-hand side of FIG. 1) and a corresponding via 124 can be separated by a particular distance along a lateral extending direction of the second package surface 128.

The first stud bumps 114 can be formed by wire bonding technology, and each of the first stud bumps 114 includes a base portion and a protruded neck or twisting-off portion 116, which has a shape resulting from a wire being twisted off by a wiring tool.

Figure 2:
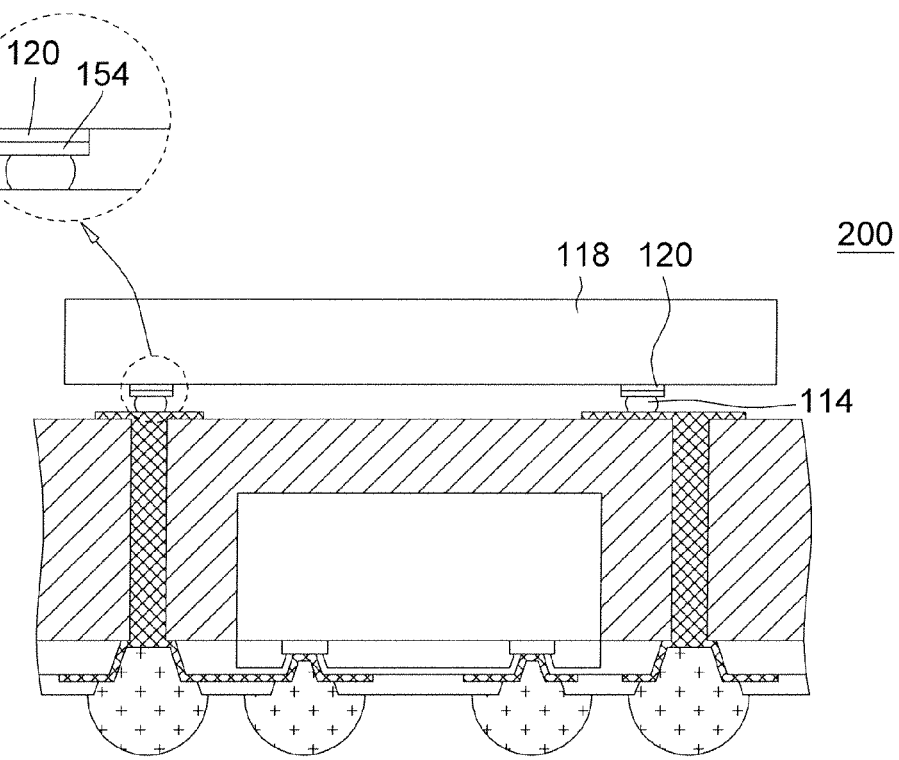
FIG. 2 shows a cross-sectional view of a stacked package assembly according to an embodiment of the invention.

Referring to FIG. 2, a cross-sectional view of a stacked package assembly 200 according to an embodiment of the invention is shown. The assembly 200 includes the semiconductor package 100 and further includes a semiconductor element 118, such as a chip or another semiconductor package. The semiconductor element 118 includes a set of second pads 120. While two semiconductor elements are shown in FIG. 2, it is contemplated that three or more semiconductor elements can be included in the assembly 200.

In the illustrated embodiment, a process of bonding the second pads 120 of the semiconductor element 118 to the first stud bumps 114 need not involve a reflow process. Rather, the bonding process can be implemented by ultrasonic bonding technology or other technology to achieve bonding with reduced temperatures. Subsequent to the bonding process, the first stud bumps 114 can take on a more rounded or oval shape, as indicated in FIG. 2.

The first stud bumps 114 can be formed from a metal or a combination of metals, such as gold (Au), aluminum (Al), copper (Cu), or metal alloys thereof. However, this list is by way of example, and the first stud bumps 114 can be formed from other electrically conductive materials. For certain implementations, gold can be desirable, since the softness of gold can be conducive to achieving bonding by applying ultrasonic energy.

Since the process of bonding the semiconductor element 118 to the first stud bumps 114 need not involve a reflow process, the number of high-temperature processes applied to the assembly 200 is reduced, thereby controlling or reducing deformation of the assembly 200.

In addition, each of the second pads 120 of the semiconductor element 118 includes a pad protection layer 154, which is formed as an outermost layer of the second pads 120 by electroplating or sputtering for connecting to the first stud bumps 114. The pad protection layer 154 can control or reduce oxidation and other damage of the second pads 120, and also can increase bonding strength or cohesion between the second pads 120 and the first stud bumps 114. The pad protection layer 154 can be formed from a nickel (Ni) layer and a gold (Au) layer, or formed from a nickel layer, a palladium (Pa) layer, and a gold layer, wherein the gold layer of the pad protection layer 154 can be formed as an outermost layer so as to be connected to the first stud bumps 114.

Referring to FIG. 1, the semiconductor device 102 includes a side surface 158, an active surface 144, and a back surface 156 opposite to the active surface 144, and also includes a set of first pads 122 and a device protection layer 132. The first pads 122 and the device protection layer 132 are formed adjacent to the active surface 144 of the semiconductor device 102. The side surface 158 extends between the active surface 144 and the back surface 156. As shown in FIG. 1, the device protection layer 132 exposes the first pad 122, and the package body 104 covers the back surface 156 and the side surface 158 of the semiconductor device 102, while exposing the first pads 122.

The first dielectric layer 106 is formed adjacent to the first package surface 126, and defines, or is formed with, a set of first apertures 130 from which the vias 124 and the first pads 122 are exposed.

The first patterned conductive layer 136 is formed adjacent to the first dielectric layer 106 and at least partially extends into the first apertures 130. The via conductive structures 152 are formed in and extend vertically along respective ones of the vias 124. Each of the via conductive structures 152 can be a hollow structure in the form of a thin, plated layer formed adjacent to an inner wall of a respective via 124, or can be a solid structure in the form of a conductive column or rod filling (e.g., substantially filling) the via 124. The first patterned conductive layer 136 and the via conductive structures 152 can be formed from a metal, a metal alloy, or other electrically conductive material.

The second patterned conductive layer 138 is formed adjacent to the second package surface 128 and extends to the via conductive structures 152. In such manner, the second patterned conductive layer 138 is electrically connected to the first patterned conductive layer 136 through the via conductive structures 152.

The second dielectric layer 110 is formed adjacent to the first patterned conductive layer 136, and defines, or is formed with, a set of second apertures 134 from which the via conductive structures 152 and a portion of the first patterned conductive layer 136 are exposed. Each of the dielectric layers 106 and 110 can be formed from a dielectric material that is polymeric or non-polymeric. For example, at least one of the dielectric layers 106 and 110 can be formed from polyimide, polybenzoxazole, benzocyclobutene, or a combination thereof. For certain implementations, at least one of the dielectric layers 106 and 110 can be formed from a dielectric material that is photoimageable or photoactive, thereby reducing manufacturing cost and time by allowing patterning using photolithography. While two dielectric layers 106 and 110 are illustrated in FIG. 1, it is contemplated that more or less dielectric layers can be included for other implementations.

The solder balls 112 are correspondingly formed or disposed in the second apertures 134 and are electrically connected to the via conductive structures 152 and the first pads 122. The solder balls 112 can be electrically connected to an external circuit, such as a printed circuit board (PCB), a semiconductor device, or another semiconductor package.

Figure 3:
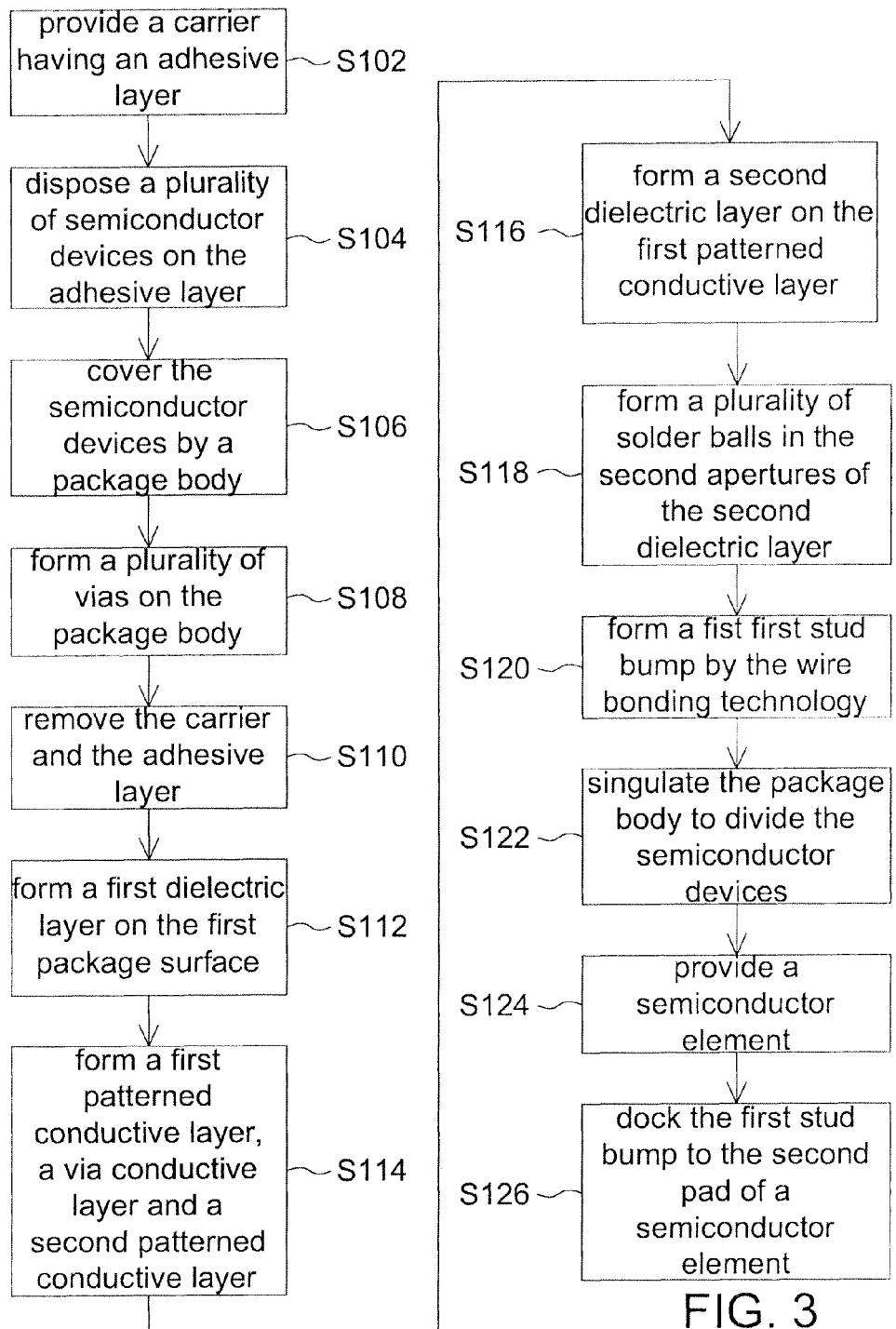
FIG. 3 shows a manufacturing method of the semiconductor package of FIG. 1 and the stacked package assembly of FIG. 2, according to an embodiment of the invention.

A manufacturing method of the semiconductor package 100 of FIG. 1 is disclosed below in FIG. 3 and FIG. 4A through FIG. 4F. FIG. 3 shows a flow chart of the method, and FIG. 4A through FIG. 4F show manufacturing operations of the method.

Figure 4A:
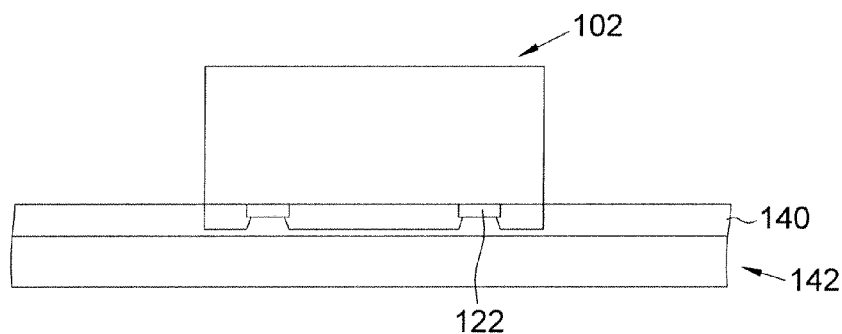
FIG. 4A through FIG. 4F show a manufacturing method of the semiconductor package of FIG. 1 and the stacked package assembly of FIG. 2, according to an embodiment of the invention.

First, in operation S102, a carrier 142 and an adhesive layer 140 of FIG. 4A are provided.

Next, in operation S104, as indicated in FIG. 4A, multiple semiconductor devices 102 are disposed adjacent to the adhesive layer 140. In particular, after circuits are manufactured and divided on a wafer, the semiconductor devices 102 are re-distributed adjacent to the adhesive layer 140, with the first pads 122 of each semiconductor device 102 facing the adhesive layer 140. According to the method of the illustrated embodiment, the re-distributed semiconductor devices 102 are then packaged to form a re-distributed wafer, so that resulting semiconductor packages can be referred as chip-scale packages (CSP's) or wafer-level packages (WLP's). For ease of presentation, one semiconductor device 102 is illustrated in FIG. 4A and discussed below. However, it should be recognized that similar operations can be carried out sequentially or in parallel on additional semiconductor devices 102.

Re-distributed semiconductor devices 102 can be separated by a suitable distance, so that solder balls can be formed between two adjacent semiconductor devices 102. For example, the solder balls 112 are disposed between the side surface 158 and an outer side surface 146 of the package body 104 as indicated in FIG. 1. Thus, the semiconductor package 100 of FIG. 1 can correspond to a fan-out semiconductor package after singulation.

Figure 4B:
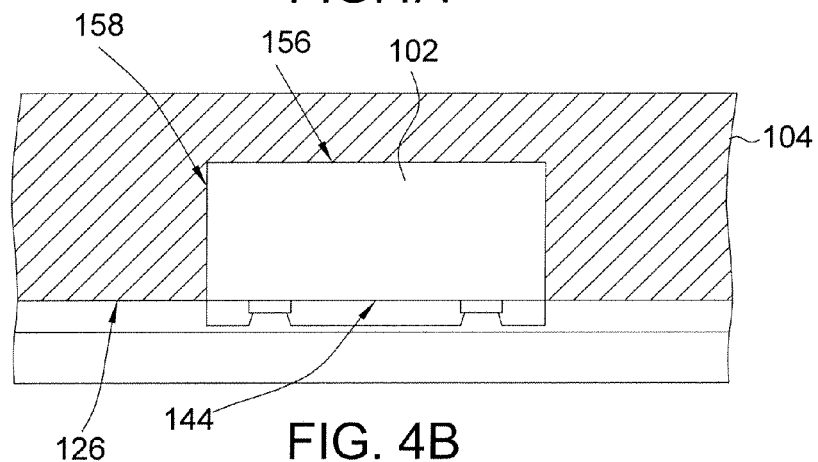

Then, in operation S106, as indicated in FIG. 4B, the package body 104 is formed, such as by applying an encapsulant using packaging technology, so as to cover the side surface 158 and the back surface 156 of the semiconductor device 102, wherein the first package surface 126 is aligned (e.g., substantially aligned) with the active surface 144. The package body 104 can include a Novolac-based resin, an epoxy-based resin, a silicone-based resin, or other suitable encapsulant. The package body 104 also can include a suitable filler, such as powdered silicon dioxide. Examples of the packaging technology noted above include compression molding, injection molding, and transfer molding. In some implementations, a thickness of the package body 104 can be reduced, such as by routing or grinding, such that the thickness of the package body 104 is substantially the same as a thickness of the semiconductor device 102, thereby exposing the back surface 156 of the semiconductor device 102.

Figure 4C:
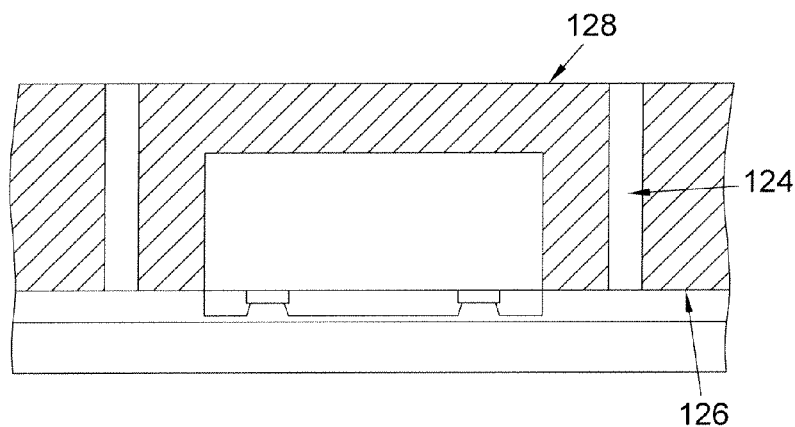

Then, in operation S108, as indicated in FIG. 4C, the vias 124 are formed in the package body 104, such as by using laser drilling technology, mechanical drilling technology, or other material-removal technology. The vias 124 extend from the first package surface 126 to the second package surface 128.

Figure 4D:
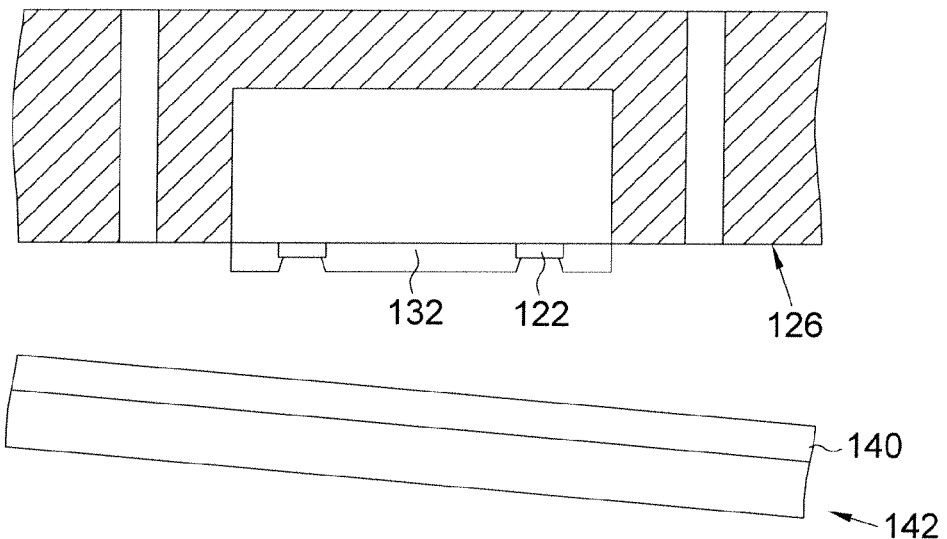

After that, in operation S110, as indicated in FIG. 4D, the carrier 142 and the adhesive layer 140 are removed, and the first pads 122 and the device protection layer 132 are exposed adjacent to the first package surface 126 of the package body 104.

Figure 4E:
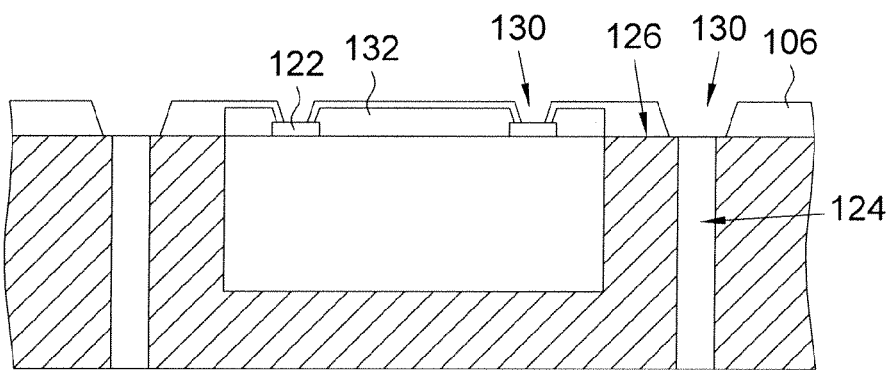

In operation S110, the re-distributed wafer is inverted so that the first package surface 126 faces upwards as indicated in FIG. 4E.

Afterwards, in operation S112, as indicated in FIG. 4E, a dielectric material is applied to cover the first package surface 126, the device protection layer 132, and the first pads 122, and then the first apertures 130 are formed in the dielectric material by patterning technology to form the first dielectric layer 106. The vias 124 and the first pads 122 are exposed by the first apertures 130. For example, the dielectric material can be applied by printing, spinning, or spraying, and patterning can be carried out by photolithography, chemical etching, laser drilling, mechanical drilling, or laser cutting.

Figure 4F:
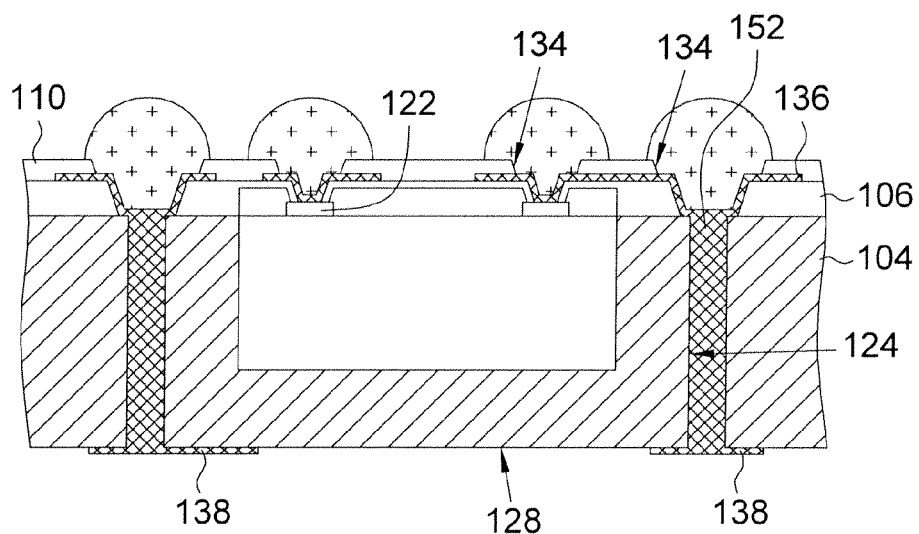

Following that, in operation S114, as indicated in FIG. 4F, an electrically conductive material is applied into the vias 124 and is also applied to cover the first dielectric layer 106 and the second package surface 128, and then the electrically conductive material is patterned to form the first patterned conductive layer 136, the second patterned conductive layer 138, and the via conductive structures 152. For example, the electrically conductive material can be applied by chemical vapor deposition, electroless plating, electrolytic plating, printing, spinning, spraying, sputtering, or vacuum deposition.

In particular, the electrically conductive material applied into the vias 124 forms the via conductive structures 152. Also, the electrically conductive material, which is applied to the first dielectric layer 106, is patterned to form the first patterned conductive layer 136, which extends along the first dielectric layer 106 and at least partially into the first apertures 130 (illustrated in FIG. 4E) so as to be electrically connected with ends of the via conductive structures 152. Moreover, the electrically conductive material, which is applied to the second package surface 128, is patterned to form the second patterned conductive layer 138, which extends along the second package surface 128 and is electrically connected with opposite ends of the via conductive structures 152.

In the present operation S114, the first patterned conductive layer 136, the via conductive structures 152, and the second patterned conductive layer 138 can be formed substantially simultaneously in the same operation. In other implementations, the first patterned conductive layer 136, the via conductive structures 152, and the second patterned conductive layer 138 can be formed from the same or different electrically conductive materials and in the same or separate operations.

Then, in operation S116, the second dielectric layer 110 of FIG. 4F is formed adjacent to the first patterned conductive layer 136 by applying and patterning a dielectric material as discussed above for the first dielectric layer 106. The second dielectric layer 110 defines the second apertures 134, wherein certain ones of the second apertures 134 expose the via conductive structures 152, and other ones of the second apertures 134 expose a portion of the first patterned conductive layer 136. In FIG. 4F, locations of certain ones of the second apertures 134 correspond to those of the first pads 122. In other implementations, the second apertures 134 and the first pads 122 can be separated at a particular distance along the lateral extending direction of the second dielectric layer 110. Also in FIG. 4F, locations of certain ones of the second apertures 134 correspond to those of the via conductive structures 152. In other implementations, the second apertures 134 and the via conductive structures 152 can be separated at a particular distance along the lateral extending direction of the second dielectric layer 110.

The first dielectric layer 106, the first patterned conductive layer 136, the via conductive structures 152, the second patterned conductive layer 138, and the second dielectric layer 110 are formed after multiple semiconductor devices 102 are re-distributed within the re-distributed wafer, and, therefore, can be referred together as a set of re-distribution layers (RDL's).

Then, in operation S118, the solder balls 112 of FIG. 1 and FIG. 4F are disposed in the second apertures 134 and electrically connected to the first patterned conductive layer 136.

In operation S118, the re-distributed wafer as illustrated in FIG. 4F can be inverted so that the second package surface 128 faces upwards.

Then, in operation S120, the first stud bumps 114 of FIG. 1 are formed adjacent to the second patterned conductive layer 138 by wire bonding technology, thus forming a package structure. In particular, the first stud bumps 114 can be formed by cutting or twisting off a wire using a wiring tool. In another implementation, inverting the re-distributed wafer in operation S118 can be omitted according to an operation mode of the wiring tool.

After that, in operation S122, the package structure is singulated to separate multiple semiconductor packages 102. Thus, the semiconductor package 100 of FIG. 1 is formed.

As indicated in FIG. 1, a cutting path passes through the package body 104, the first dielectric layer 106, and the second dielectric layer 110, which are overlapped with one another, so that, after singulation, an outer side surface 146 of the package body 104, an outer side surface 148 of the first dielectric layer 106, and an outer side surface 150 of the second dielectric layer 110 are aligned (e.g., substantially aligned). The outer side surface 146 of the package body 104 extends between the first package surface 126 and the second package surface 128 opposite to the first package surface 126.

Then, in operation S124, the semiconductor element 118 of FIG. 2 is provided. After that, in operation S126, the first stud bumps 114 are bonded to the second pads 120 by ultrasonic bonding technology to stack the semiconductor element 118 on the first stud bumps 114. Thus, the assembly 200 of FIG. 2 is formed.

Figure 5:
FIG. 5 shows a semiconductor element according to another embodiment of the invention.

Referring next to FIG. 5, a semiconductor element 318 according to another embodiment of the invention is shown. The semiconductor element 318 is similar to the semiconductor element 118 of FIG. 2, and at least one difference is that the semiconductor element 318 further includes a set of second stud bumps 352. Characteristics and formation of the second stud bumps 352 can be similar to those of the first stud bumps 114, and those aspects are not repeated here.

Like the manufacturing method of the assembly 200, the first stud bumps 114 of FIG. 1 can be bonded to the second stud bumps 352 of the semiconductor element 318 of FIG. 5 by ultrasonic bonding technology, so that the semiconductor element 318 can be stacked on the first stud bumps 114 to form a stacked package assembly. It is also contemplated that stacking can be achieved using the second stud bumps 352, in the absence of the first stud bumps 114.

In another implementation, the semiconductor element 318 can be realized by a semiconductor package that is similar to the semiconductor package 100 of FIG. 1. In such manner, two or more semiconductor packages (similar to the semiconductor package 100) can be stacked by ultrasonic bonding technology.

According to embodiments of the invention, a semiconductor package includes a stud bump, which is formed by wire bonding technology and can be bonded or joined to a semiconductor element to form a stacked package assembly. Since the process of bonding the semiconductor element to the stud bump can be carried out without reflow, an undesirable deformation resulting from high temperatures can be controlled or reduced.

While the invention has been described with reference to the specific embodiments thereof, it should be understood by those skilled in the art that various changes may be made and equivalents may be substituted without departing from the true spirit and scope of the invention, as defined by the appended claims. In addition, any modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, subdivided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
    a semiconductor device including a side surface, an active surface, and a back surface opposite to the active surface, wherein the semiconductor device includes a first pad adjacent to the active surface;
    a package body including a first package surface and a second package surface opposite to the first package surface, and a through-hole extending between the first package surface and the second package surface, wherein the first pad is exposed adjacent to the first package surface, and the back surface and the side surface of the semiconductor device are covered by the package body;
    a conductive via disposed in the through-hole and extending between the first package surface and the second package surface;
    a first dielectric layer adjacent to the first package surface, wherein the first dielectric layer has a first aperture exposing a first end of the conductive via;

a first patterned conductive layer adjacent to the first dielectric layer and electrically connected to at least one of the first pad of the semiconductor device and the first end of the conductive via;

a second patterned conductive layer adjacent to the second package surface and electrically connected to a second end of the conductive via; and a stacking element adjacent to the second package surface and electrically connected to the second patterned conductive layer, wherein the stacking element is laterally displaced from the conductive via.

2. The semiconductor package according to claim 1, wherein the stacking element includes a stud bump.

3. The semiconductor package according to claim 2, wherein the stud bump includes a base portion and a protruded neck portion.

4. The semiconductor package according to claim 1, wherein the stacking element is inwardly disposed with respect to the conductive via.

5. The semiconductor package according to claim 1, wherein the stacking element is disposed outside a periphery of the semiconductor device.

6. The semiconductor package according to claim 1, wherein the active surface of the semiconductor device is aligned with the first package surface.

7. The semiconductor package according to claim 1, further comprising:
a second dielectric layer adjacent to the first patterned conductive layer, wherein the second dielectric layer has a second aperture that exposes at least one of the first patterned conductive layer and the first end of the conductive via; and
a solder ball disposed in the second aperture.

8. The semiconductor package according to claim 7, wherein a side surface of the package body, a side surface of the first dielectric layer, and a side surface of the second dielectric layer are aligned with one another.

9. A semiconductor package, comprising:
a semiconductor device including a side surface, an active surface, and a contact pad adjacent to the active surface;
a package body including a lower package surface and an upper package surface, wherein the contact pad of the semiconductor device is exposed adjacent to the lower package surface, and the side surface of the semiconductor device is covered by the package body;
a conductive structure at least partially extending between the lower package surface and the upper package surface;
a lower patterned conductive layer adjacent to the lower package surface and electrically connected to the contact pad of the semiconductor device and a lower end of the conductive structure;
an upper patterned conductive layer adjacent to the upper package surface and electrically connected to an upper end of the conductive structure; and
an interconnect disposed on the upper patterned conductive layer, wherein the interconnect is laterally displaced from the conductive structure.

10. The semiconductor package according to claim 9, wherein the interconnect is inwardly disposed with respect to the conductive structure.

11. The semiconductor package according to claim 9, wherein the interconnect includes a stud bump that is disposed inwardly of the conductive structure and outwardly of a side surface of the semiconductor device.

12. The semiconductor package according to claim 9, further comprising:
a first dielectric layer disposed between the lower package surface and the lower patterned conductive layer, wherein the first dielectric layer defines a first aperture aligned with the contact pad of the semiconductor device and a second aperture aligned with the lower end of the conductive structure, and the lower patterned conductive layer is electrically connected to the contact pad of the semiconductor device and the lower end of the conductive structure through the first aperture and the second aperture, respectively.

13. The semiconductor package according to claim 12, further comprising:
a second dielectric layer adjacent to the lower patterned conductive layer, wherein the second dielectric layer defines a third aperture aligned with the first aperture defined by the first dielectric layer.

14. The semiconductor package according to claim 12, further comprising:
a second dielectric layer adjacent to the lower patterned conductive layer, wherein the second dielectric layer defines a third aperture aligned with the second aperture defined by the first dielectric layer.

15. A semiconductor package, comprising:
a semiconductor device including a contact pad;
a package body encapsulating the semiconductor device with the contact pad exposed adjacent to a lower surface of the package body;
a conductive structure at least partially extending between the lower surface of the package body and an upper surface of the package body;
a lower patterned conductive layer adjacent to the lower surface of the package body and extending between the contact pad of the semiconductor device and a lower end of the conductive structure;
an upper patterned conductive layer extending from an upper end of the conductive structure and along the upper surface of the package body; and
a stacking element disposed over the upper patterned conductive layer and including a base portion and a protruded portion disposed over the base portion, wherein the stacking element is laterally displaced from the conductive structure.

16. The semiconductor package according to claim 15, wherein the stacking element is a stud bump.

17. The semiconductor package according to claim 15, wherein the stacking element is inwardly disposed with respect to the conductive structure.

18. The semiconductor package according to claim 15, wherein the stacking element is disposed outwardly of a side surface of the semiconductor device.

19. The semiconductor package according to claim 15, further comprising:
a first dielectric layer disposed between the package body and the lower patterned conductive layer, wherein the first dielectric layer defines a first aperture aligned with the contact pad of the semiconductor device and a second aperture aligned with the lower end of the conductive structure, and the lower patterned conductive layer is electrically connected to the contact pad of the semiconductor device and the lower end of the conductive structure through the first aperture and the second aperture, respectively.

20. The semiconductor package according to claim 19, further comprising:
a second dielectric layer adjacent to the lower patterned conductive layer, wherein the second dielectric layer defines a third aperture aligned with one of the first aperture and the second aperture defined by the first dielectric layer.

* * * * *